United States Patent [19]

Tsui et al.

[11] 4,426,648

[45] Jan. 17, 1984

[54] SIMULTANEOUS SIGNAL DETECTION FOR IFM RECEIVERS BY DETECTING INTERMODULATION PRODUCTS

[75] Inventors: James B. Y. Tsui, Centerville; Rudy L. Shaw, Huber Heights, both of Ohio

[73] Assignee: The United States of America as represented by the Secretary of the Air Force, Washington, D.C.

[21] Appl. No.: 271,753

[22] Filed: Jun. 9, 1981

[51] Int. Cl.³ .................... G01S 7/36; G01R 23/16
[52] U.S. Cl. ........................... 343/18 E; 324/77 B; 324/79 R; 343/5 SA
[58] Field of Search ............. 324/77 B, 79 R; 343/5 SA, 18 E

[56] References Cited

U.S. PATENT DOCUMENTS

| | | | |
|---|---|---|---|
| 3,656,097 | 4/1972 | Massa | 324/79 R X |
| 3,939,411 | 2/1976 | James | 324/77 H |
| 4,025,920 | 5/1977 | Reitboeck et al. | 343/5 SA X |
| 4,188,628 | 2/1980 | Langeraar et al. | 343/5 SA |
| 4,215,344 | 7/1980 | Phillips, Jr. | 343/18 E |
| 4,336,541 | 6/1982 | Tsui et al. | 343/18 E |

Primary Examiner—T. H. Tubbesing
Attorney, Agent, or Firm—Donald J. Singer; Bernard E. Franz

[57] ABSTRACT

An apparatus for use in conjunction with an instantaneous frequency measurement (IFM) receiver, for detecting the presence of two or more RF pulse signals, differing in frequency, between the onset of the first RF signal pulse and the completion of the frequency encode strobe. A low pass filter branching off from the output of the limiting amplifier of the IFM receiver will allow passage of only the low frequency intermodulation products formed from the presence of simultaneous signals. These intermodulation products are then detected and sampled during the time period of interest with a flag set if simultaneous pulses are present. This flag, which indicates to the receiver that the data associated with the received pulse may contain erroneous information, is maintained until reset by the onset of a succeeding RF pulse.

5 Claims, 7 Drawing Figures

Simultaneous Signal Detection Circuit

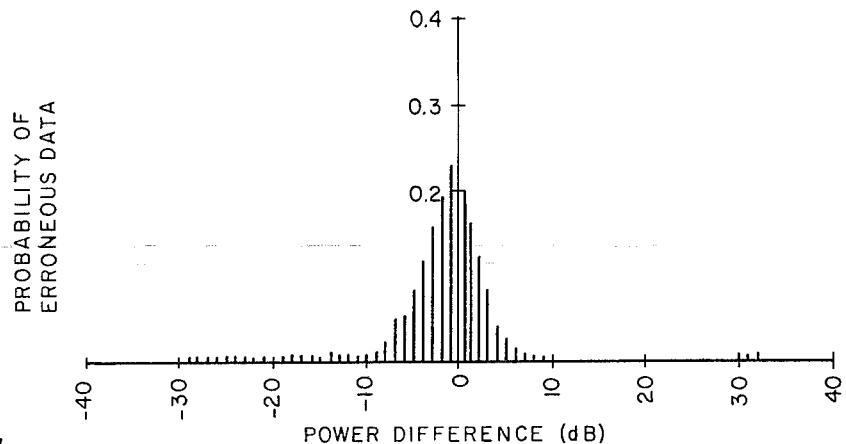
Fig. 1 Probability of Erroneous Data with Two Time Coincident Leading Edge Signals
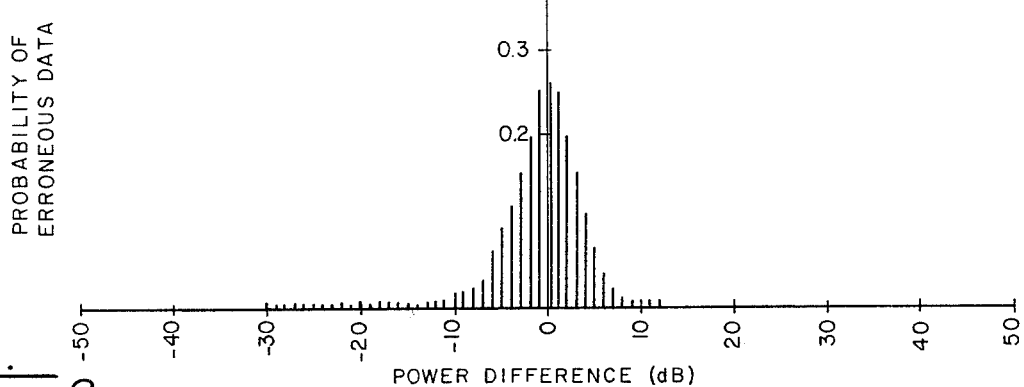
Fig. 2 Probability of Erroneous Data with Two Signal Leading Edges Separated by 40 ns
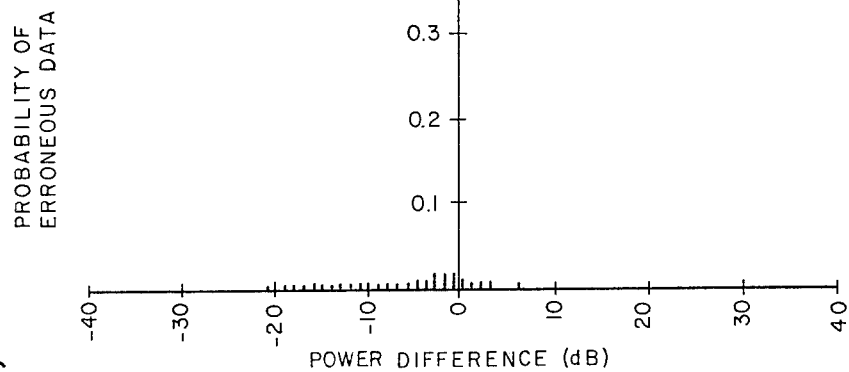
Fig. 6 Probability of Erroneous Data with Simultaneous Signal Detection Circuit (Two Signal Leading Edges are Time Coincident)

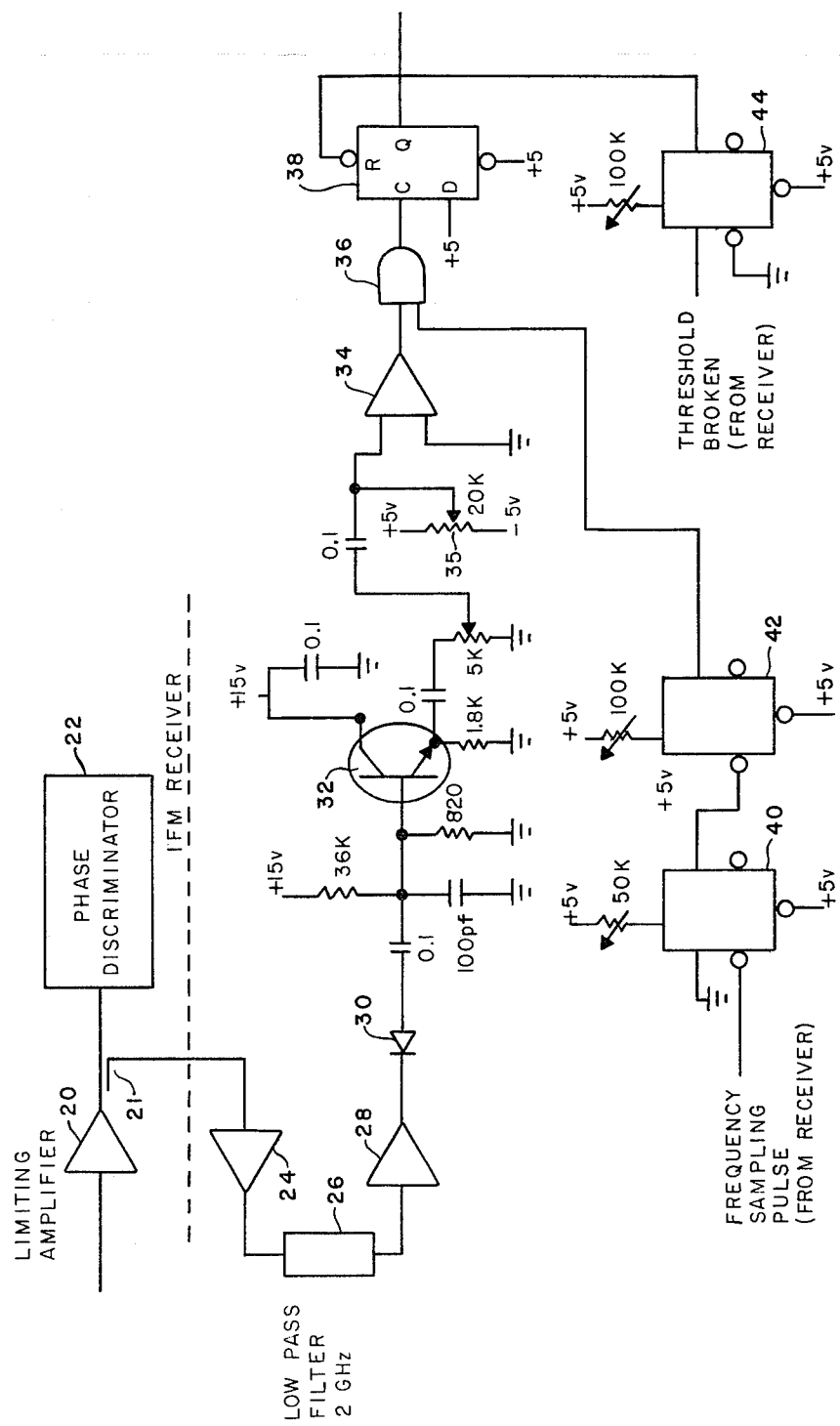
Fig. 3  Simultaneous Signal Detection Circuit

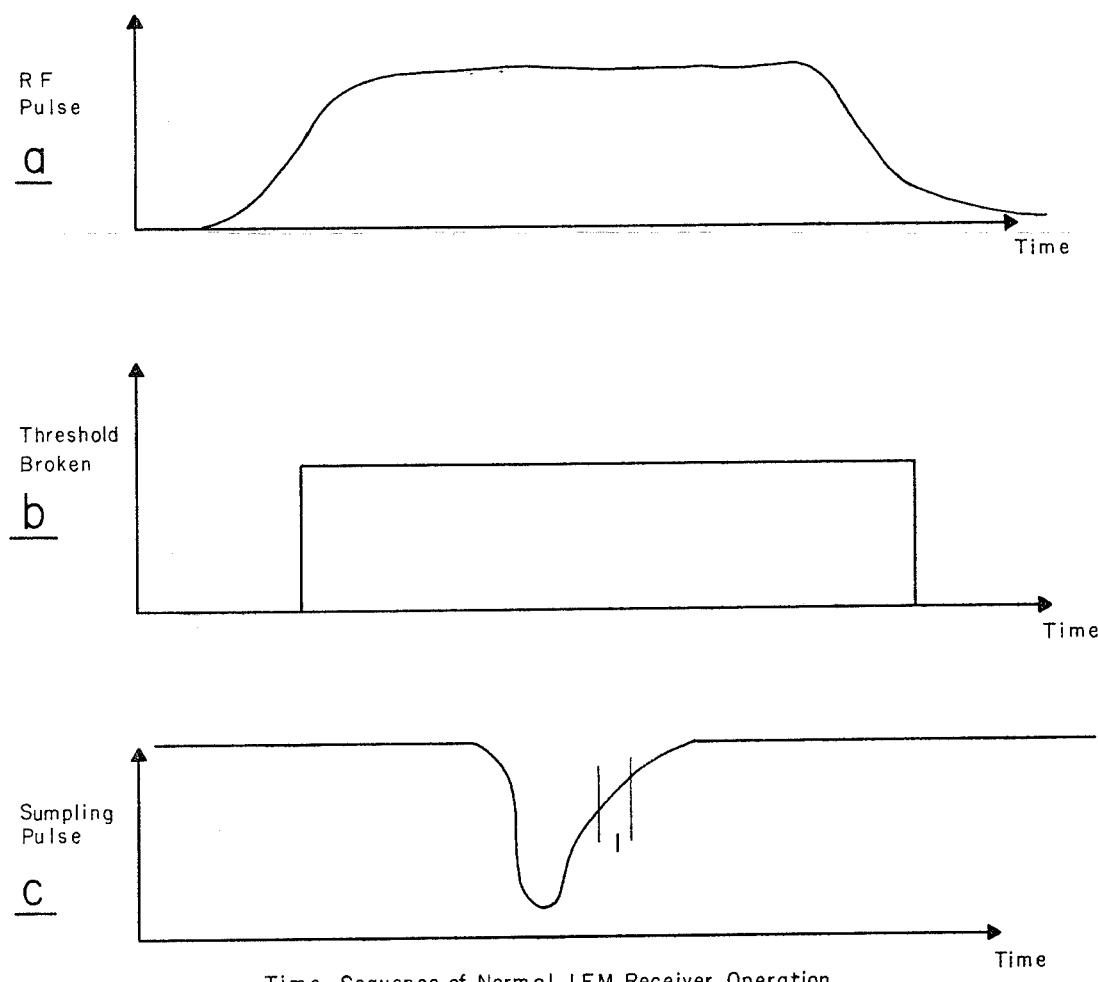
Fig. 4 Time Sequence of Normal IFM Receiver Operation
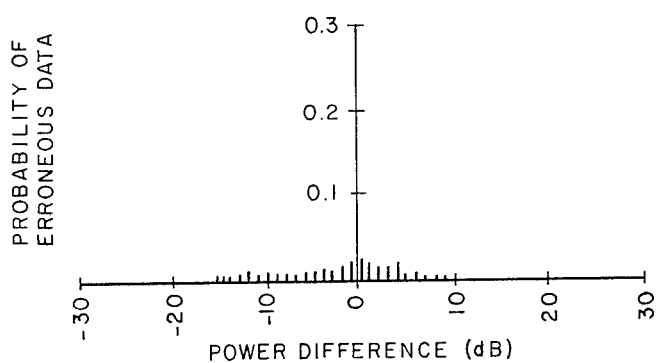
Fig. 7 Probability of Erroneous Data with Simultaneous Signal Detection Circuit (Two Signal Leading Edges are Separated by 40ns)

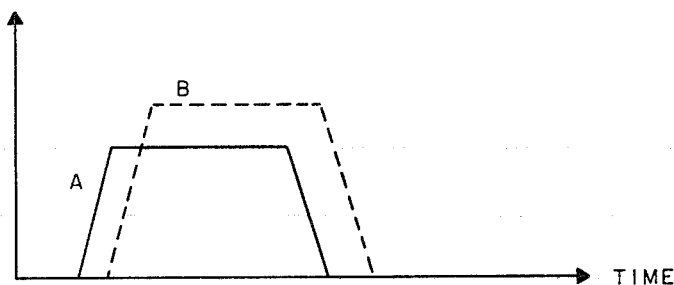
a SIGNALS A AND B IN TIME DOMAIN
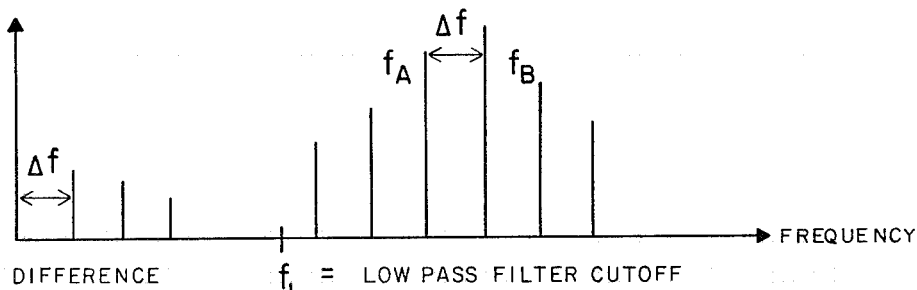
b SIGNALS A AND B IN FREQUENCY DOMAIN WITH THEIR DIFFERENCE FREQUENCIES
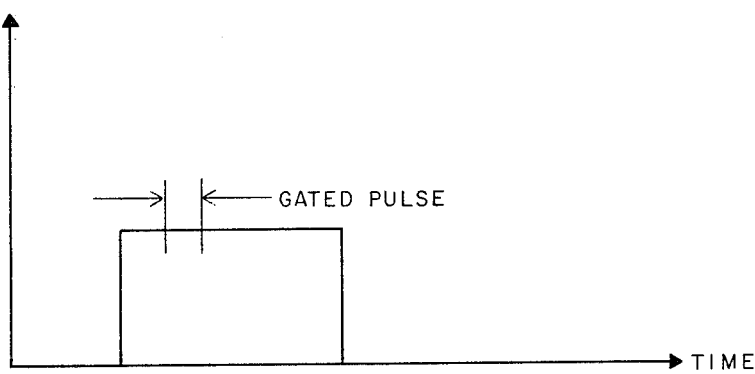
c OUTPUT FROM COMPARATOR
*Fig. 5* SIMULTANEOUS SIGNAL DETECTION CIRCUIT RESPONSE TO TWO SIGNALS

SIMULTANEOUS SIGNAL DETECTION FOR IFM RECEIVERS BY DETECTING INTERMODULATION PRODUCTS

RIGHTS OF THE GOVERNMENT

The invention described herein may be manufactured and used by or for the Government of the United States for all governmental purposes without the payment of any royalty.

BACKGROUND OF THE INVENTION

The field of the invention is in the high frequency radio receiver art and more particularly that of radar receivers having frequency measuring capability.

The conventional Instantaneous Frequency Measurement (IFM) receiver is a radio frequency (RF) receiver used primarily in electronic warefare (EW). Its basic function is to measure the frequency of pulsed signals radiated from hostile radar. Although some IFM receivers have the capability of measuring pulse amplitude, pulse width, and time of arrival, this invention is only concerned with the frequency measurement capability of the receiver.

Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length $\tau$. Since the phase differences between the delayed and non-delayed receiver paths are functions of the input signal frequency, conversion of the phase difference signals to video provides signals whose amplitudes are related to the phase delay. These video signals typically take the form $\sin \omega\tau$ or $\cos \omega\tau$, where $\omega$ is the angular frequency of the processed input signal. The $\sin \omega\tau/\cos \omega\tau$ signals are delivered to the encoding network which makes amplitude comparisons of the signals, determines the numerical value of $\omega$, and generates the digital frequency descriptive word.

Characteristically, to achieve wide, unambiguous bandwidths and fine frequency resolution, it is necessary for the IFM receiver to have multiple delay lines, correlators and comparators to accomplish the frequency measurement. The delay between the leading edge of the RF pulse and the strobe to encode the $\sin \omega\tau/\cos \omega\tau$ video signals can be no shorter than the length of time it takes for the signal to transition the longest delay line, correlator and encoding network. As a general rule, the strobe to encode a sample occurs less than 120 nsec after the leading edge of the first RF pulse.

An IFM receiver has many attractive features necessary for EW applications, such as small size, light weight, wide instantaneous bandwidth, and fine frequency resolution. Unfortunately, a conventional IFM receiver has inherent signal detection problems when presented with time coincident received pulse signals. It is fairly common for many modern radars to simultaneously emit pulse signals of two or more frequencies, resulting in their arriving simultaneously at an intercept receiver. If the time difference between the leading edges of the two RF incoming pulses is greater than the time needed to complete the strobe encoding process (i.e., 120 nsec), the receiver will detect and frequency encode the leading RF signal without any problem. However, if the two RF pulses overlap with a time between leading edges less than the time to complete an encode strobe, one of three conditions will result. Either the first signal will be correctly encoded, or the second signal will be correctly encoded, or the receiver will encode ambiguous data (erroneous frequency data). Consequently, an IFM receiver can convey ambiguous frequency data when near-simultaneous RF pulses are received.

The probability of obtaining erroneous frequency data from an IFM receiver is also influenced by the relative power difference between the incoming RF pulses. The effects of amplitude differences are best understood with reference to the plots presented in FIGS. 1 and 2 representing actual results from a tested IFM receiver. FIG. 1 indicates the probability of encoding erroneous data (which is defined as more than 10 MHz away from either input signal) with respect to the power difference in two RF signals when there is zero time delay between their leading edges, namely, simultaneous RF pulses. In FIG. 1, the erroneous frequency data produced in the worst case is about 23%. FIG. 2 shows the effects of a 40 nsec lag between the leading edges of the first and second pulses. In FIG. 2, the worst case is about 25%.

Recognizing that even a small percent of erroneous frequency data can cause the signal processor following the IFM receiver to measurably slow or completely malfunction, it is essential that the existence of simultaneous or near-simultaneous RF pulses of different frequencies be detected. Once the concurrence is detected, the encoded frequency measurement can be disregarded or flagged for special handling.

The best known prior art is that contained by U.S. Pat. No. 3,939,411 to patentee James which discloses an IFM system which includes a technique to actually measure pulse signals emitted simultaneously. This technique utilizes a dispersive delay line which is not utilized in the present invention. A potential disadvantage exists with this technique when a series of input pulses is received which though separated at the input of the dispersive delay line, actually becomes simultaneous at the output. The James patent also does not flag the simultaneous pulse data as having a probability of erroneous data.

A patent application Ser. No. 176,434 now U.S. Pat. No. 4,336,541, was filed on Aug. 8, 1980, by James Tsui et al on a Simultaneous Signal Detection Circuit for an Instantaneous Frequency Measurement Receiver. The circuit in that application will detect simultaneous signals when the leading edges of the two signals are separated more than 20 nsec. When the leading edges of the two signals are time coincident or less than 20 nsec, the detection circuit does not sense the simultaneous signals. Clearly, a need exists to detect simultaneous signals with leading edge separation less than 20 nsec.

SUMMARY OF THE INVENTION

The present invention relates to an improvement for use with an instantaneous frequency measurement receiver. When added to a conventional IFM receiver, the circuit comprising the invention provides an improved operational capability to the receiver in that the receiver can now detect the occurrence of multiple, time coincident RF pulses. Consequently, the significant error rates normally associated with such time concurrent pulses are measurably reduced.

A principal object of this invention is to provide an IFM receiver with the capability of detecting the existance of simultaneous RF pulses which occur prior to the IFM receiver's frequency encode strobe.

Another object of this invention is to provide an IFM receiver with the capability of detecting near-simultaneous pulses, where the time delay between the leading edges of the pulses is between zero and twenty nanoseconds.

According to the invention, a low pass filter branching off from the output of the limiting amplifier of the IFM receiver will allow passage of only the low frequency intermodulation products formed from the presence of simultaneous signals. These intermodulation products are then detected and sampled during the time period of interest with a flag being set if simultaneous pulses are present. If no simultaneous pulses are present, no intermodulation products will be formed.

A feature of this invention is to provide an IFM receiver with the capability of detecting near-simultaneous pulses where the time delay between the leading edges of the pulses is between zero and forty nanoseconds.

Another feature of this invention is its ability to flag the data associated with near-simultaneous pulses as being suspect and possibly containing erroneous information.

BRIEF DESCRIPTION OF THE DRAWINGS

FIGS. 1 and 2 are graphs showing the probability of an IFM receiver encoding erroneous data, as a function of the levels separating the signal amplitudes, for RF pulses whose leading edges are concurrent and separated by 40 nsec, respectively.

FIG. 3 contains a schematic of one embodiment of the invention.

FIG. 4 is a graph of signal pulses generated in a normal instantaneous frequency measurement receiver.

FIG. 5 is a graph of signal pulses generated within the embodying apparatus when two RF pulses are received near-simultaneously.

FIGS. 6 and 7 are graphs of the probability of error of a receiver operated with the embodying apparatus for RF pulses whose leading edges are concurrent and separated by 40 nsec, respectively.

DETAILED DESCRIPTION OF THE INVENTION

The preferred embodiment of the invention is shown in FIG. 3. In most modern IFM receivers, the RF chain contains a limiting amplifier 20 which is located before a phase discriminator 22. The function of the limiting amplifier is to boost weak signals to higher power levels while attenuating only the strong signals. The ideal limiting amplifier will produce an output signal at a fixed power level independent of the input signal level. When one signal reaches the limiting amplifier its output will contain the same signal along with its higher harmonics. However, if more than one signal reaches the limiting amplifier, its output will contain harmonics according to the following equation:

$$f_{m,n} = \pm mf_1 \mp nf_2$$

where $f_1$ and $f_2$ are the two input frequencies, and m and n are positive integers. By detecting the existence of the harmonics generated per the above equation, the presence of simultaneous signals can be detected. A signal from the limiting amplifier is coupled out through a 10 db coupler 21 to an RF amplifier 24. This RF amplifier is powered by a relatively low voltage compared to its normal applied voltage in order to keep the amplifier in a nonlinear operating region to enhance the generation of harmonics. The signal from the RF amplifier 24 is fed into a low pass filter 26, which prevents the high frequency input signals from traveling into the detection circuit but passes all the difference frequencies (generated per the equation) below the lower limit of the RF input. Typically, a 2 GHz low pass filter would be utilized although other comparable values are suitable. Low pass filter 26 feeds the signal to an amplifier 28 to boost its power level and pass it to a detector 30. Detector 30 converts the RF signal into a video signal and feeds the video signal to a transistor 32. As shown in FIG. 3, transistor 32 is connected into the circuit in an emitter follower configuration to match impedence. Transistor 32 amplifies the video signal and passes it to a comparator 34. Comparator 34 compares the video signal with ground. The existence of simultaneous pulses will be detected by the output of comparator 34 being "high". The absence of simultaneous pulses will give a "low" output. Connected just prior to comparator 34 to the line containing the video signal is a voltage source coupled by variable resistor 35, which can be adjusted to provide a variable threshold for comparator 34.

The modern IFM receiver has a frequency sampling pulse which, in the present invention, is inputted to two monostable multivibrators 40 and 42 connected in series. These multivibrators generate the leading and trailing edges of a time gate which is fed into an AND gate 36. By ANDing the time gate with the output of comparator 34, the spurious signals which occur during times of no interest are gated out. The output signal of AND gate 36, which is either a "low" or "high" state, is fed into a D type flip-flop 38, which in turn, outputs a "high," i.e., flagged, signal indicating the presence of simultaneous pulses until flip-flop 38 is reset to a "low" state. A threshold broken signal, which is furnished by the IFM receiver to indicate the onset of the first received RF pulse, is fed to a monostable multivibrator 44 to generate a pulse of sufficient duration which, when connected to flip-flop 38, will reset it.

During normal operation, an incoming RF pulse begins the frequency measurement cycle. The incoming RF pulse of waveform (a) of FIG. 4 is detected by a detector circuit which produces a threshold broken signal, waveform (b) of FIG. 4. The leading edge of the threshold broken signal initiates various parametric circuits within the receiver including the frequency measurement strobe, also called the frequency sampling pulse (waveform (c) of FIG. 4). The delay between the signals of waveforms (b) and (c) of FIG. 4 is necessary to allow the frequency measurement circuits to stabilize prior to sampling. The actual sampling occurs on the trailing edge (1) of the sampling pulse. If the IFM receiver is not receiving simultaneous pulses, the output of the limiting amplifier will not contain the low frequencies necessary to pass the low pass filter 26.

If two signals A and B, with frequencies $f_A$ and $f_B$ as shown in waveform (a) (time domain) and waveform (b) (frequency domain) of FIG. 5 arrive at the receiver nearly simultaneously, they will produce certain difference frequencies via limiting amplifier 20 and amplifier 24. These difference frequencies will pass through low pass filter 26 and will be amplified by amplifier 28.

These signals are then detected, amplified and fed to comparator 34 whose output signal is shown in waveform (c) of FIG. 5. The gated pulse generated from the leading edge of the frequency sampling pulse is used to determine whether simultaneous pulses are present during the sampling period and is displayed in waveform (c) of FIG. 5. Simultaneous pulses occurring before or after the sampling period do not affect the frequency reading of the receiver.

The present invention was tested under the same conditions used to generate the graphs shown in FIGS. 1 and 2. FIGS. 6 and 7 show the beneficial results of utilizing the circuitry of the present invention. The probability of encoding erroneous data has been substantially reduced for the case where the pulses are received simultaneously (FIG. 6), and for the case where the leading edges of the pulses are separated by 40 nsec (FIG. 7). These two figures indicate that in the worst case, only about 2% of the erroneous data cannot be flagged using this invention.

In summary, the IFM receiver has a high probability of delivering to an associated digital processor an erroneous frequency word if a second pulse arrives prior to the frequency encode strobe. If this occurs the processor may spend time attempting to process ambiguous data or may totally miss the significance of the signal. The present invention will provide the IFM receiver with the capability of detecting the existence of simultaneous signals with time coincident leading edges which occur prior to the frequency encode strobe, and provides an indication to the processor of this detection. This technique combined with the technique in the prior Tsui patent application Ser. No. 176,434, which is assigned to the same assignee, can provide simultaneous signal detection over the full time range prior to the frequency encode strobe and over most of the dynamic range of the receiver.

Thus, while preferred constructional features of the invention are embodied in the structure illustrated herein, it is to be understood that changes and variations may be made by the skilled in the art without departing from the spirit and scope of the invention.

We claim:

1. In an instantaneous frequency measurement (IFM) receiver, the said receiver having receiving means including a limiting amplifier, which produces signals containing difference frequencies only if received pulses of different frequencies occur simultaneously, the improvement comprising:

a. a filtering means coupled to said limiting amplifier for blocking the passage of the principal signal frequencies coming from said limiting amplifier while passing low frequency difference frequencies;

b. detector means coupled to said filtering means detecting said difference frequencies and converting RF signals into video signals; and c. bistable means coupled to said detector means, said bistable means being set in response to said video signals, whereby the presence of simultaneous signals is flagged.

2. The apparatus recited in claim 1, including gating means coupled between said detector means and said bistable means for gating said video signals with a time pulse actuated by a time strobe command occurring during an interval in time during which said IFM receiver is actively processing the received signal.

3. The apparatus recited in claim 2, including means to reset said bistable means not later than the onset of the leading edge of a succeeding pulse.

4. The apparatus recited in claim 3, including comparator means coupled between said detector means and said gating means for comparing the video signal with a reference potential, and producing a digital output signal when the video signal exceeds a threshold value.

5. The apparatus recited in claim 4, including coupling means for obtaining a relatively small signal from the output of the limiting amplifier; first amplifier means connected between said coupling means and said filtering means for enhancing the generation of harmonics by operating said first amplifier means in a nonlinear region; second amplifier means connected between said filtering means and said detector means for amplifying the output signal of said filtering means; a third amplifier means connected in an emitter follower configuration between said detector means and said comparator means for boosting the detected signal.

* * * * *